United States Patent [19]
Yang et al.

[11] Patent Number: 5,903,168
[45] Date of Patent: May 11, 1999

[54] SWITCHABLE MCM CMOS I/O BUFFERS

[75] Inventors: Jyh-Ren Yang; Chung-Tao Chang, both of Hsinchu; Ruey-Wen Chien, Taipei, all of Taiwan

[73] Assignee: Industrial Technology Research Institiute, Hsinchu, Taiwan

[21] Appl. No.: 08/822,413

[22] Filed: Mar. 21, 1997

[51] Int. Cl.$^6$ .................................. H03K 19/0175
[52] U.S. Cl. ................................ 326/86; 326/82
[58] Field of Search ...................... 326/21, 37, 82, 326/86, 90, 104, 83; 327/407

*Primary Examiner*—Jon Santamauro
*Assistant Examiner*—Don Phu Le

[57] ABSTRACT

A switchable I/O buffer for multi-chip modules comprising a conventional I/O buffer and a miniaturized I/O buffer. A path switch selects the conventional I/O buffer or the minaturized I/O buffer according to whether the I/O interconnection is for communication off the module or chip-to-chip communication within the module. The miniaturized I/O buffer comprises a single-ended I/O buffer without electrostatic discharge protection. Two layout structures are designed for the switchable I/O buffer. A first layout structure having its path switching control provided by either a cell-programmable method or a mask-programmable method can be used for a multi-chip module or a PWB single package. A second layout structure using a pad-programmable method to provide the path switching control is suitable for a multi-chip module with flip-chip attachment technology. Four different circuit implementations of the switchable I/O buffer are presented. The switchable I/O buffer achieves higher performance with lower power dissipation in that the unnecessary heavy loading and electrostatic discharge protection are eliminated from the interconnection for chip-to-chip communication within the multi-chip module.

6 Claims, 9 Drawing Sheets

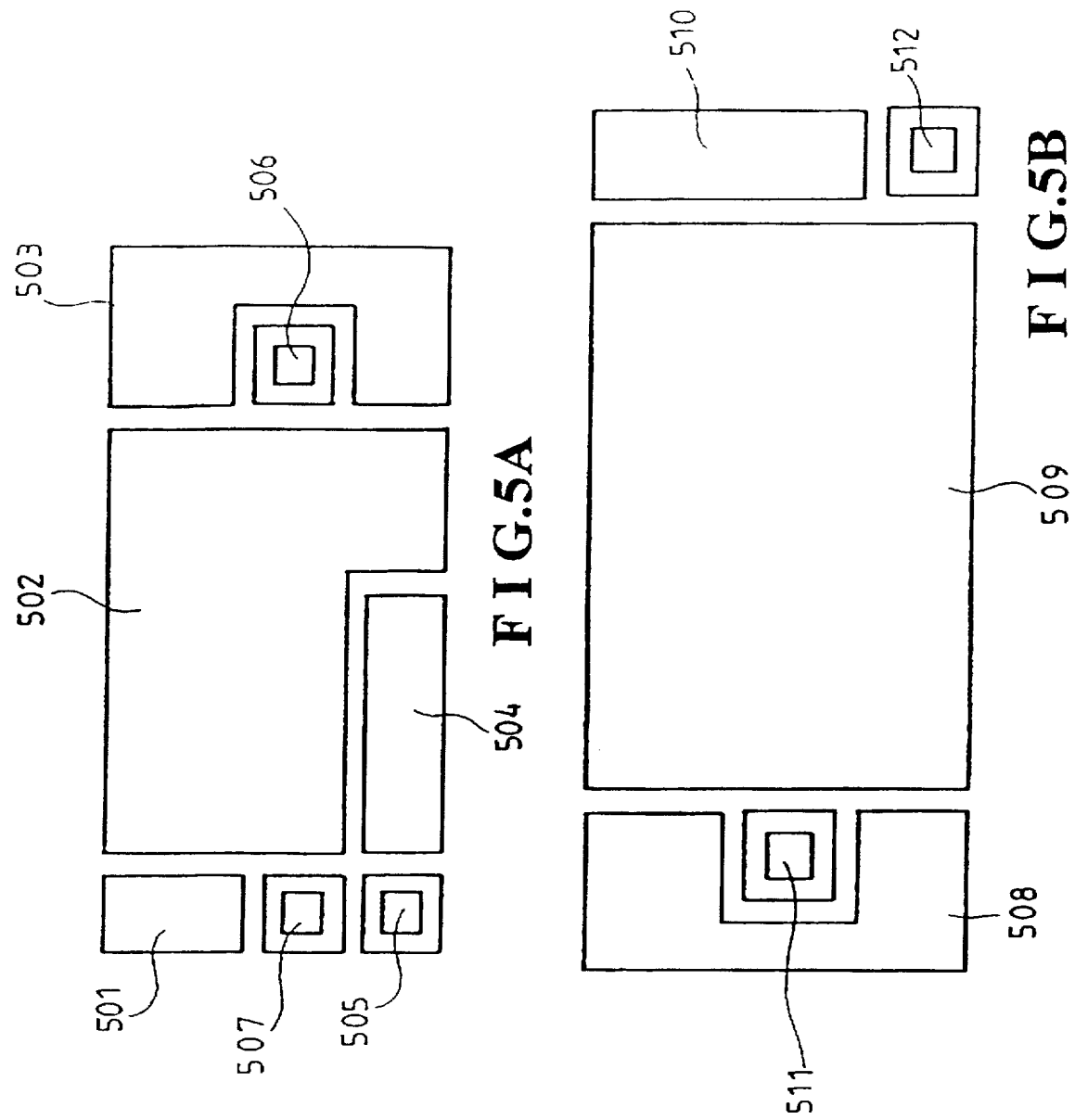

SWITCHABLE MCM CMOS I/O BUFFERS

FIELD OF THE INVENTION

The present invention relates to the design of input/output buffers for an integrated circuit chip and the packaging of integrated circuit chips, and more specifically to input/output buffers for integrated circuit chips packaged using multi-chip module technology.

BACKGROUND OF THE INVENTION

The simplest definition of a multi-chip module (MCM) is that the integrated circuit module (or chip carrier) has more than one chip on it as shown in FIG. 1. An explosive growth in the research and development efforts devoted to MCM for the purpose of breaking through the density and performance limitations of single chip modules has been witnessed in the past few yeas. A multi-chip module may combine many high-performance integrated circuit chips with a custom designed substrate structure to take full advantage of the integrated circuit performance. As an example, Fujitsu's MLG-MCM module contains 144 integrated circuit chips. The complex substrate structure is the heart of the MCM technology. It can be fabricated by multi-layers of ceramic material, polymer, silicon, metal, glass ceramic material, printed circuit boards (PCB), etc., using thin films, thick films, co-fired, or layered methods.

A formal definition of MCM has been given by the Institute for Interconnecting and Packaging Electronic Circuits (IPC). They define three main categories of MCMs as follows:

1. MCM-C: A module uses thick film technology such as fireable metals to form conductive patterns, and is constructed entirely from ceramic or glass-ceramic materials, or possibly, other materials having a dielectric constant above 5. In short, a MCM-C is constructed on ceramic (C) or glass-ceramic substrate.
2. MCM-L: A multi-chip uses laminate structures and employs printed circuit board (PCB) technology to form predominantly copper conductors and vias. These structures may sometimes contain thermal expansion controlling metal layers. In short, MCM-L utilizes PCB technology of reinforced plastic laminates (L).
3. MCM-D: A module has a substrate on which the multi-layered signal conductors are formed by the deposition of thin-film metals on unreinforced dielectric materials with a dielectric constant below 5 over a support structure such as silicon, ceramic material, or metal. In short, MCM-D uses deposited metal and unreinforced dielectric on a variety of rigid substrate base.

The techniques of chip on board (COB) have been widely used for packaging multi-chip modules. COB is defined as the direct attachment of bare chips on a PCB or substrate by wire bonding, tape automated bonding (TAB), or flip chip attachment (FCA). As shown in FIG. 2, a substrate or printed circuit board 201 is used for attaching integrated circuit chips on it. A first circuit chip 202 is attached to the substrate or printed circuit board 201 by wire loops 203 using wire bonding technology. A second circuit chip 204 is attached to the substrate or printed circuit board 201 by tap leads 205 with tape automated bonding technology. A third chip 206 is flipped and connected to the substrate or printed circuit board 201 by solder balls 207 using flip chip attachment technology. FCA, which uses smaller solder balls as the joint structure, has the following advantages over other types of packaging technology:

Higher density I/O connections by area array joints.

Superior electrical performance due to small bumps for joints.

Multi-chip attachment by a single reflow of solder bumps.

For most interconnection traces on a MCM substrate, the loads are mostly capacitive and on the order of a few pFs. The trace load can be so small as to be comparable to some of the heavily loaded lines found on-chip. These interconnection traces can thus be treated as an extension of the on-chip network. Due to the small trace-load, the sizes of the MCM I/O buffers, which are designed in chip and connected to these traces, can be scaled down in chip-to-chip communication.

Currently, in MCM designs, silicon chips with conventional I/C buffers (CIOB) have been used in a FCA configuration. The main reason is that these chips have already been fabricated and are available for immediate use. Nevertheless, CIOBs for these chips are not well suited for a MCM environment. The performance of the MCM is not optimized and certain features are degraded. These features include increased power dissipation and increased chip-to-chip delay. In addition, conventional I/O buffers are usually designed with electrostatic discharge (ESD) protection structure. For some MCM I/O buffers, the ESD structure is unnecessary because the buffers are only used for the chip-to-chip communication within a MCM package.

As technologies of both MCM and FCA continue to improve, they offer features such as low inductance, reduced size and low parasitic capacitance. All these features provide a prospective future for VLSI system with higher speed and smaller size on a MCM module. However, for a better system that is optimized with a MCM packaging environment, some improvements can be achieved in the chip design.

A differential type of I/O buffers (DIOB) used as miniaturized I/O buffers in a MCM-FCA environment was presented by T. Gabara et al. in "An I/O Buffer Set Silicon Multi-Chip Module (MCM)", pp. 147–152, IEEE Multi-Chip Module Conference, MCMC-93, March, 1993. Although DIOB provides a good operation speed and noise margin, the additional bump pads required may reduce the yield rate of manufacturing the MCM. As the high-end packaging techniques such as MCM-D remain a market trend, the need for specialized I/O buffers is necessary for achieving high performance at low power dissipation.

SUMMARY OF THE INVENTION

The present invention has been made to address the need of specialized I/O buffers as mentioned above for MCM technology. The primary object of the invention is to provide a switchable I/O buffer structure for achieving higher performance at lower power consumption in MCM modules. The switchable I/O buffer structure of this invention comprises a miniaturized single-ended MCM I/O buffer without ESD, a conventional I/O buffer with ESD and a pre-buffer with a path selection switch. Either the miniaturized or the conventional I/O buffer can be used to optimize the MCM performance based on whether the interconnection is for chip-to-chip communication within the module or access to the outside world off the module.

A second object of this invention is to provide methods for making the I/O buffer path switching structure. The mechanism of providing the path switching control can be implemented by a cell-programmable method, a mask-programmable method, or a pad-programmable method. Among the methods, the cell-programmable method gives the most flexibility but requires an extra area cost. The mask-programmable method incurred an extra process cost due to an additional mask. The pad-programmable method transfers the switching structure from the chip layers to the MCM substrate and is more appropriate for working with FCA technology to reduce the size of the switching pad and the complexity of the bonding.

Another object of this invention is to provide the layout structures for fabricating the switchable MCM I/O buffers. A first layout structure that can be applied to both cell-programmable and mask-programmable methods is presented. The first layout structure can be used in a MCM-FCA or a PWB single package environment. A second layout structure for using with a pad-programmable method is also presented. The second layout structure is designed for a MCM package employing FCA technology.

Yet another object of the present invention is to provide circuit structures for the implementation of the switchable MCM I/O buffers. Four different types of circuits for the switchable I/O buffers are described. The I/O buffers can be functionally divided as a transmitter and a receiver. In using the I/O buffers of this invention, the transmitter and the receiver has to be of the same type. The circuit structures of both the transmitter and the receiver are described for the four different types of I/O buffers.

According to this invention, the switchable I/O buffer is a general I/O buffer that matches the MCM environment and can be used within any chips processed by CMOS or BiCMOS technology, or the like. It is functionally divided as a transmitter and a receiver. The transmitter is responsible for driving the signal off a chip, while the corresponding receiver on another chip receives the signal. Furthermore, both the transmitter and the receiver have three function blocks: a CIOB (with ESD), a MIOB (without ESD), and a pre-buffer with a path switch.

Depending on the method of providing the path switching control, there are two types of layout structures to be chosen for the switchable I/O buffers. The first layout structure that reserves the conventional large size I/O pads for matching the conventional wire bonding technology is used for both cell-programmable and mask-programmable methods. It can be employed in the environment of either a MCM or a PWB single package. The second layout structure is designed for the pad-programmable method. In the second layout structure, an extra input pad is added in the transmitter for accepting the switching control signal and all pads are equal in size for use with FCA technology.

Four different implementations of the switchable I/O buffers are presented. Each I/O buffer type has a transmitter and a receiver. Both the transmitter and the receiver have their respective conventional buffer path and miniaturized buffer path. The first I/O buffer type uses an OR gate for the path switching control in the transmitter. The second I/O buffer type uses two tri-state inverters as the path switching gates. Two transmission gates are used in the third I/O buffer type to select the buffer path. The fourth I/O buffer type uses an OR gate and a tri-state inverter to do the path switching control.

BRIEF DESCRIPTION OF THE DRAWINGS

FIG. 5 shows the second layout structure for the transmitter and the receiver of the switchable I/O buffers of this invention for which a pad-programmable method should be used to provide the path switching control.

DETAILED DESCRIPTION OF THE PREFERRED EMBODIMENTS

Figure 1:
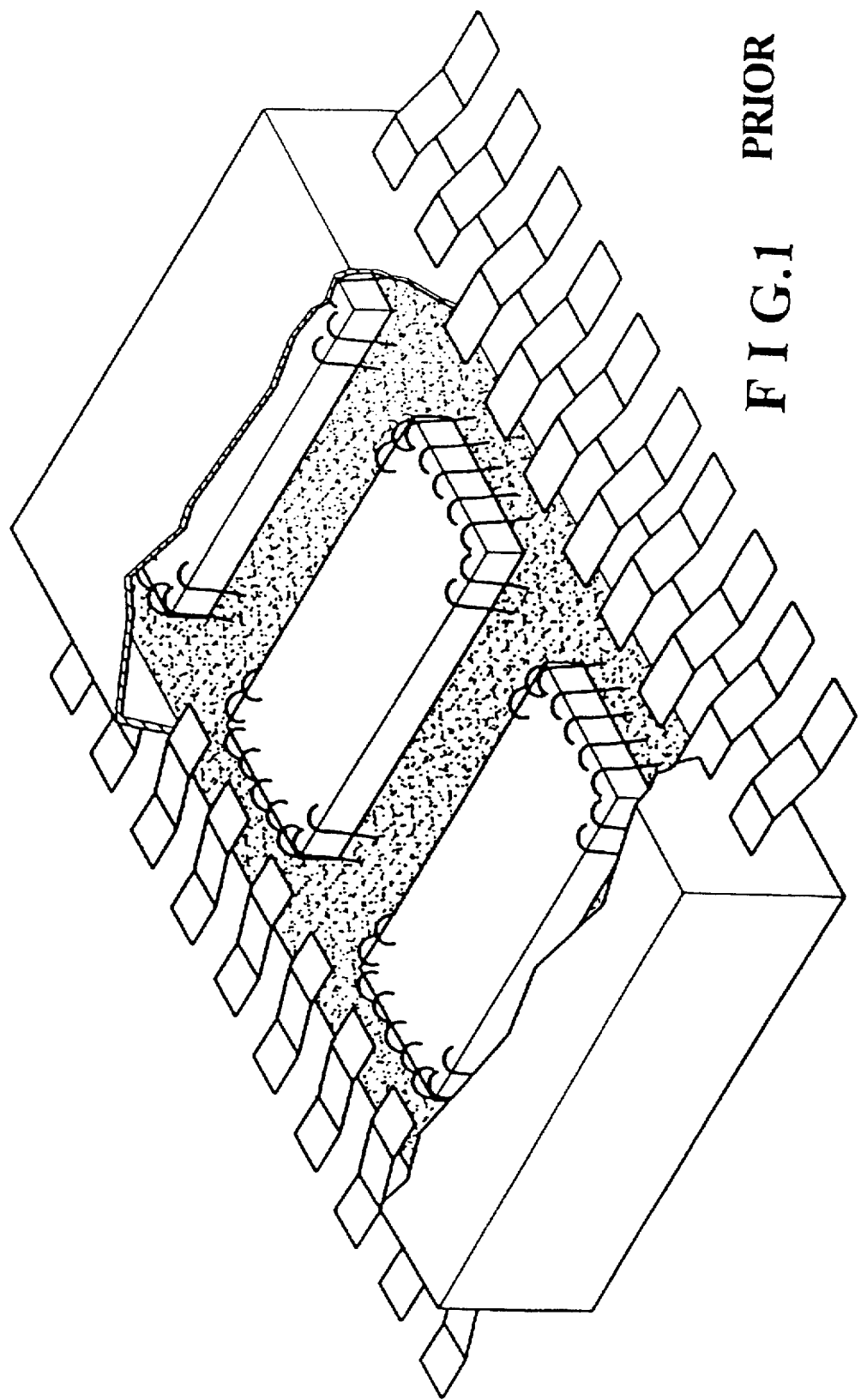
FIG. 1 shows an exposed view of a MCM package containing more than one bare chips.
Figure 2:
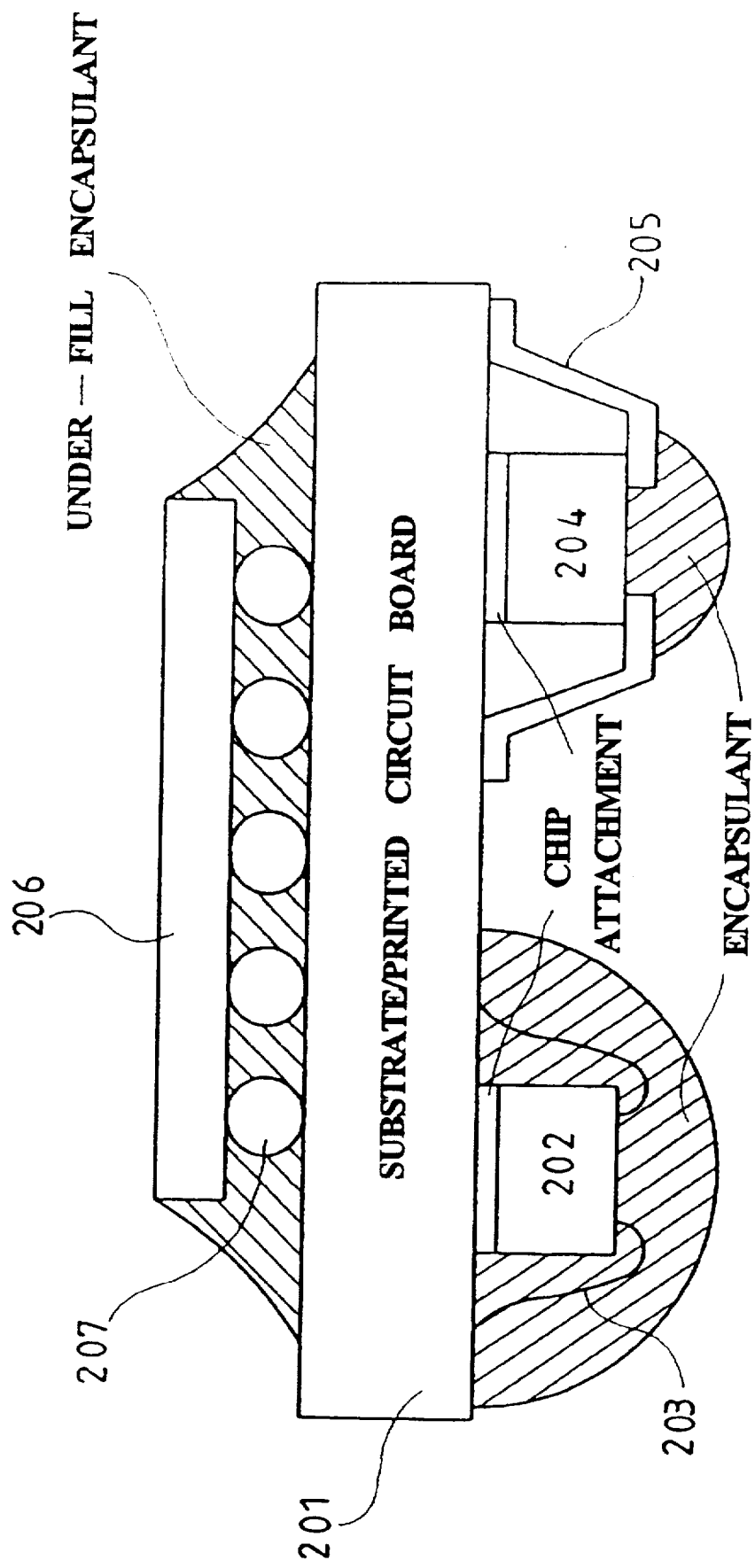
FIG. 2 is a cross-sectional view of a MCM substrate or a printed circuit board having three bare dies bonded on it with wire bonding, tape automated bonding, and flip chip attachment technology.
Figure 3:
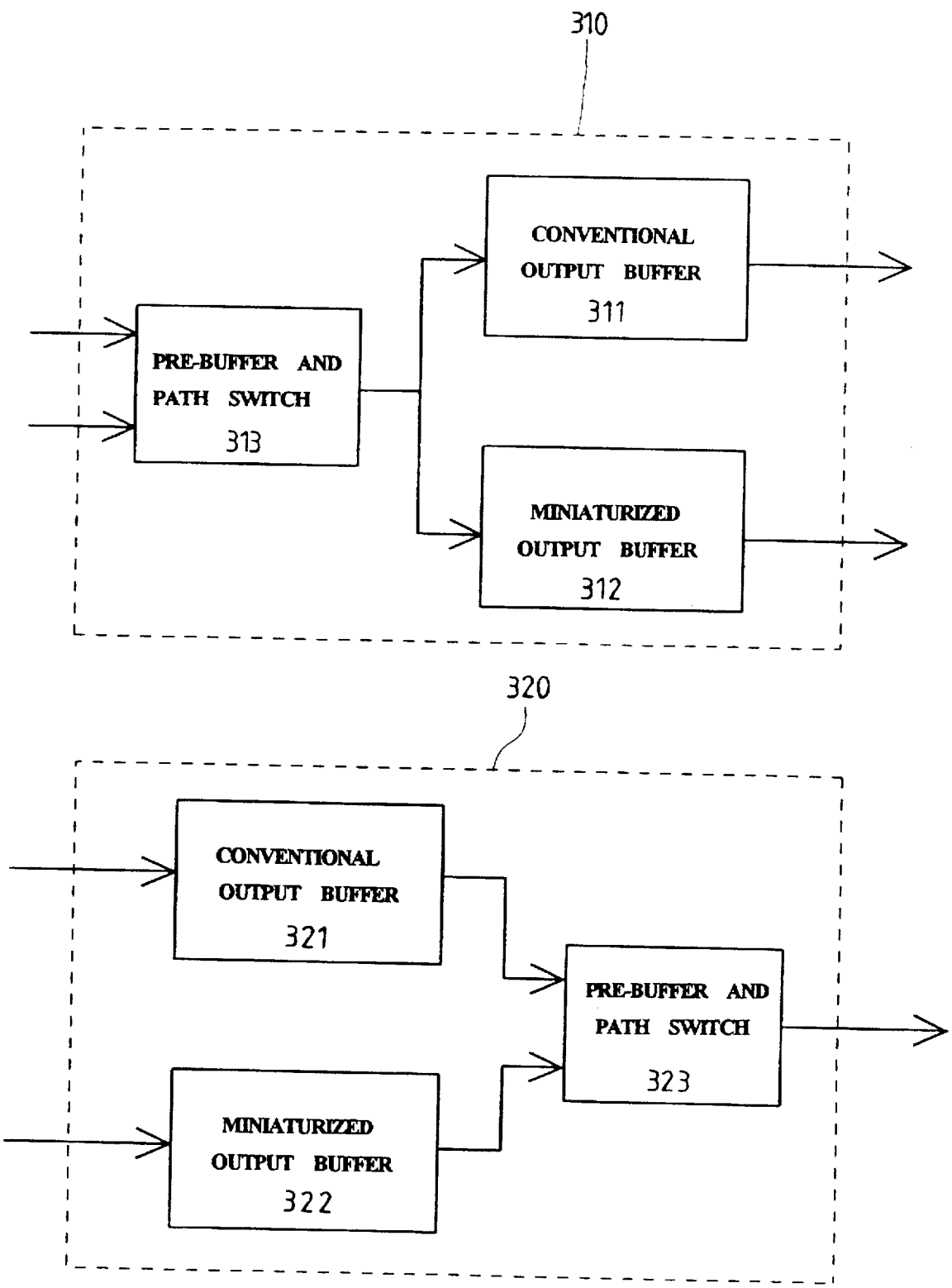
FIG. 3 shows the structure of the switchable MCM I/O buffer including a transmitter and a receiver of this invention.

With reference to FIG. 3, the switchable I/O buffers (SIOB) for multi-chip modules of this invention can be functionally divided into two parts. One is the transmitter 310 for driving signal off the chip and the other is the receiver 320 for receiving signal from outside of the chip. Furthermore, each part can be decomposed into three smaller function blocks: (1) a conventional I/O buffer with ESD (CIOB) 311, 321, (2) a miniaturized singled-ended MCM I/O Buffer without ESD (MIOB) 312, 322, and (3) a pre-buffer 313, 323 with a path switch. The transmitter has a signal input, a path switching control input, a conventional buffer output, and a miniaturized buffer output. The receiver has a conventional buffer input, a miniaturized buffer input, and a receiver output.

In using the SIOB, the choice of either a CIOB or a MIOB path should always be made the same in the corresponding transmitter 310 and receiver 320. The choice depends on the on/off module characteristic of the I/O signal. In the transmitter, a path switching signal 'sel' is provided for selecting one of these two paths. In the receiver, two pull-high/low active resistors are used to do the same job.

The ESD protection structure has been removed from the MIOB of this invention in that these buffers are designed for chip-to-chip communication within the MCM package. They have no direct access to the outside world (i.e., outside of MCM module) However, ESD protection is still preserved on any I/O buffers (as those in CIOBs) which are used for connections to or off the MCM package. Because the ESD protection structure has been removed, the chip area required for the pre-buffer block and the MIOB block is about one tenth of the CIOB block. The reduction in chip area helps reduce the capacitive load by 3–4 pF and hence improves the operation speed.

There are several methods of providing the path switching signal 'sel' for use in SIOB. But some trade-offs should be made among these methods. The cell-programmable (CP) method gives the most flexibility because it allows users to make the selection on the fly by software using switching control bits stored in a chip. Nevertheless, the extra area cost incurred may become a major concern. If the storage cells for the switching control bits can be merged into other available mechanisms such as those used for the boundary scan test, the extra area cost may be reduced to a minimum.

Figures 4A, 4B:
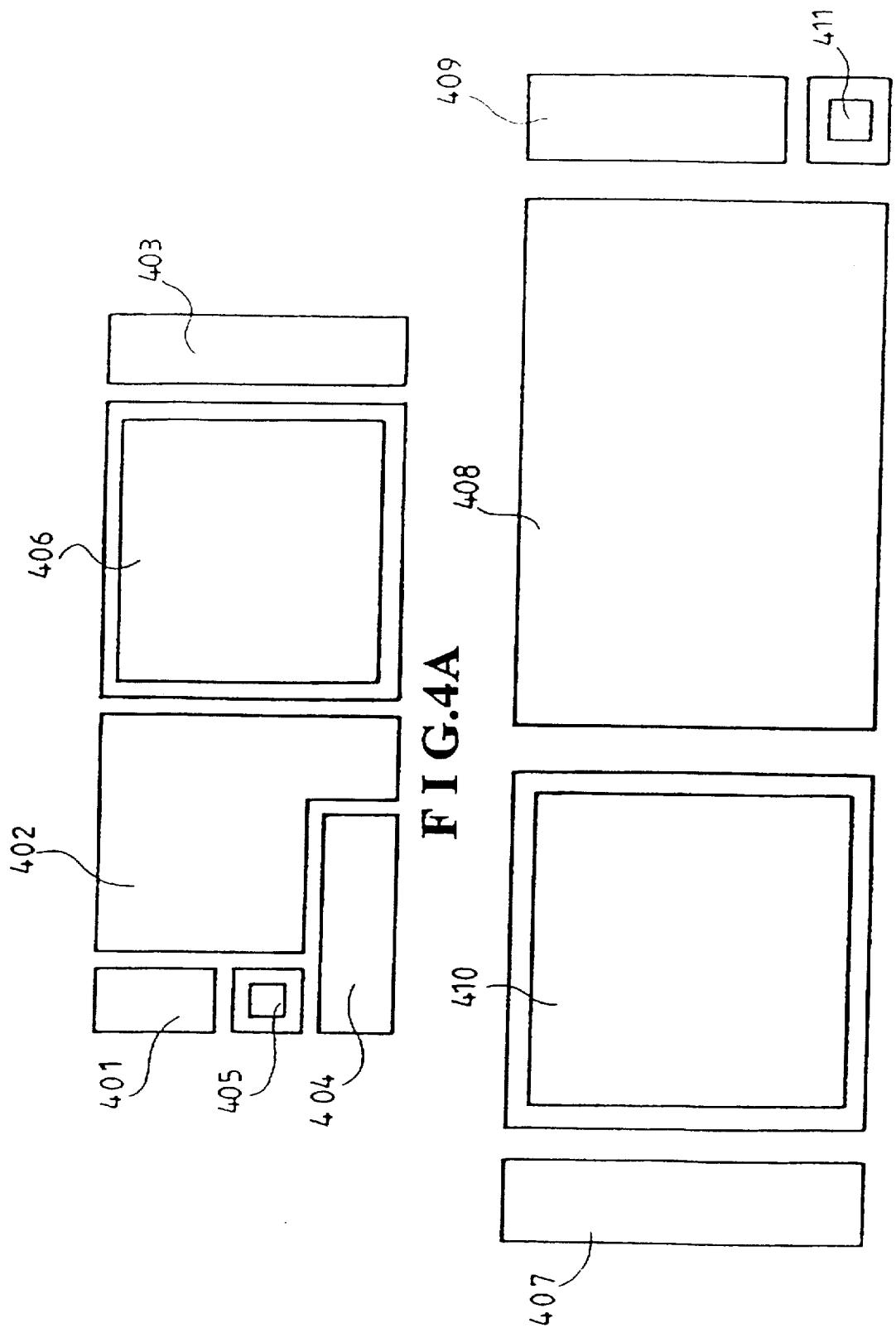
FIG. 4 shows the first layout structure for the transmitter and the receiver of the switchable I/O buffers of this invention for which either a cell-programmable or mask-programmable method can be used to provide the path switching control.

The mask-programmable (MP) method is an alternative method that does not require an extra area cost of providing the path switching signal. But an extra process cost is incurred due to the need of the added mask. When a MP or CP method is employed for SIOB to give the control signal 'sel', the I/O buffer can be used for either a MCM-FCA environment or a PWB single package. The first SIOB layout structure as shown in FIG. 4 should be adopted. FIGS. 4A and 4B illustrate the layout structure of the transmitter and the receiver of the SIOB of this invention respectively. The switching control signal for the layout structure can be provided with either a MP or CP method.

The layout structure of the transmitter as shown in FIG. 4A includes an area 401 having an output signal pre-buffer with a path switch, two areas 402 and 403 comprising a CIOB with ESD protection for driving signal to the outside world (i.e. off the MCM package), an area 404 comprising a MIOB without ESD protection for chip-to-chip communication within the MCM package, an area 405 having a solder-ball output bump pad for the MIOB and an area 406 having a conventional CIOB output pad. As shown in FIG. 4B, the layout structure of the receiver includes areas 407 and 408 comprising a CIOB with ESD protection and a pull high/low resistor for receiving signal from outside of the MCM package, an area 409 comprising a MIOB and a pull high/low resistor without ESD for chip-to-chip communication within the MCM package, an area 410 having a conventional CIOB input pad and an area 411 having a solder-ball input bump pad for the MIOB.

As to the third alternative, the pad-programmable (PP) method, one extra input pad for injecting 'sel' is required for the transmitter of the MIOB. Different from the mask-programmable method, the control signal trace for 'sel' comes from the substrate instead of the chip layers. Therefore, structure of providing the 'sel' is transferred from the chip to the MCM substrate. The size of the switching pad and bonding complexity should be reduced in order to be cost effective. In comparison, with possibly the least complexity in chip design, the pad-programmable strategy is more appropriate for a FCA environment. FIGS. 5A and 5B illustrate the second layout structure of the transmitter and the receiver of the SIOB respectively. The layout structure is especially designed for a MCM-FCA environment.

The layout structure of the transmitter as shown in FIG. 5A includes an area 501 having an output signal pre-buffer with a path switch, two areas 502 and 503 comprising a CIOB with ESD for driving signal to the outside world (i.e. off the MCM package), an area 504 comprising a MIOB without ESD for chip-to-chip communication within the MCM package, an area 505 having a solder-ball output bump pad for the MIOB, an area 506 having a conventional CIOB output pad and an area 507 having a solder-ball input bump pad for providing the path switching signal from the MCM substrate. As shown in FIG. 5B, the layout structure of the receiver includes two areas 508 and 509 comprising a CIOB with ESD protection and a pull high/low resistor for receiving signal from outside of the MCM package, an area 510 comprising a MIOB and a pull high/low resistor without ESD protection for chip-to-chip communication within the MCM package, an area 511 having a conventional CIOB solder-ball input pad and an area 512 having a solder-ball input bump pad for the MIOB.

The first layout structure as shown in FIG. 4 still reserves the conventional large-size I/O pad for matching the conventional wire bonding technology. Hence, it can be employed in either a MCM or a PWB single package environment. It is also important to note that a set of CIOB without switchable capability must be provided for storing the switching control bits into the chip. In the second layout structure, an extra input pad is added in the transmitter for accepting the signal 'sel', and all pads are equal in size with side length about 35 μm for use with FCA technology. The extra pad can be fixed at situ as shown, or implanted at any other ideal place within the chip. All three pads 505, 506, and 507 have the same size and are small enough to get the benefit of the FCA technology. Both types of layout structures for SIOB can be arranged in a fairly compact manner and, hence, occupy smaller chip area. The switchable I/O buffers can be designed with various driving capability. Therefore, they can serve as a set of standard cells for using in general ASIC design.

Essentially, both types of layout structure shown in FIGS. 4 and 5 have the same basic topology, which can be used to show the function blocks of all the SIOB circuits of this invention to be described later. The realization of the switchable MCM I/O buffers will be discussed and illustrated using four preferred embodiments. The description will be focused on the miniaturized I/O buffers and the path switches. The conventional I/O buffer, which is well known to a person skilled in the field, will be shown only with a simplified black box having two inverters in it.

FIRST EMBODIMENT

Figure 6A:
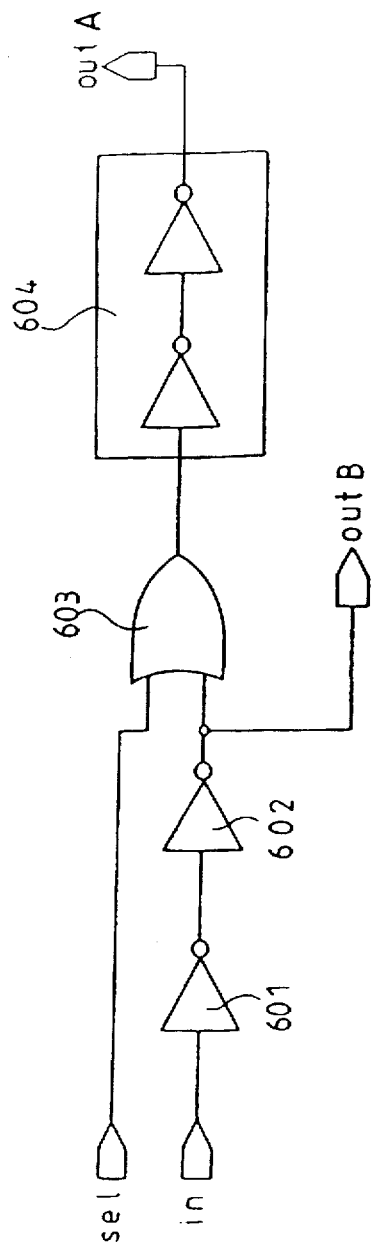
FIG. 6 shows the circuit structure for the transmitter and the receiver of the first embodiment of the switchable I/O buffer of the present invention in which an OR gate is used for providing the path switching control.

FIG. 6 shows the first embodiment of the SIOB. The transmitter of the first embodiment as shown in FIG. 6A comprises a first inverter 601, a second inverter 602, an OR gate 603 and a conventional output buffer TBUFF 604. There are two input signals 'in' and 'sel', and two output signals 'outA' and 'outB'. The conventional output buffer path includes the first and second inverters 601, 602 and the conventional output buffer 604. The miniaturized output buffer path of this invention includes only the first and second inverters 601, 602.

The input signal 'in' comes from the core logic of the chip and the input control signal 'sel' determines whether the input signal goes through the conventional buffer path or the miniaturized buffer path. When 'sel' is pulled high by either a signal coming from an internal programmable storage cell or a hard-wired solder-ball input bump pad, the output of the OR gate 603 is high and the output signal 'outA' is kept at a constant level. Under this circumstance, the only signal path is through the miniaturized output buffer path. When 'sel' is low, both 'outA' and 'outB' have output signals. However, in practice only one output pad is bonded to the substrate, depending on whether the conventional output buffer 604 or the miniaturized output buffer is desired, and hence either 'outA' or 'outB' is transmitted. It should be noted that the switching activity for the conventional output buffer 604 has been avoided because of its large size and considerable power consumption.

Figure 6B:
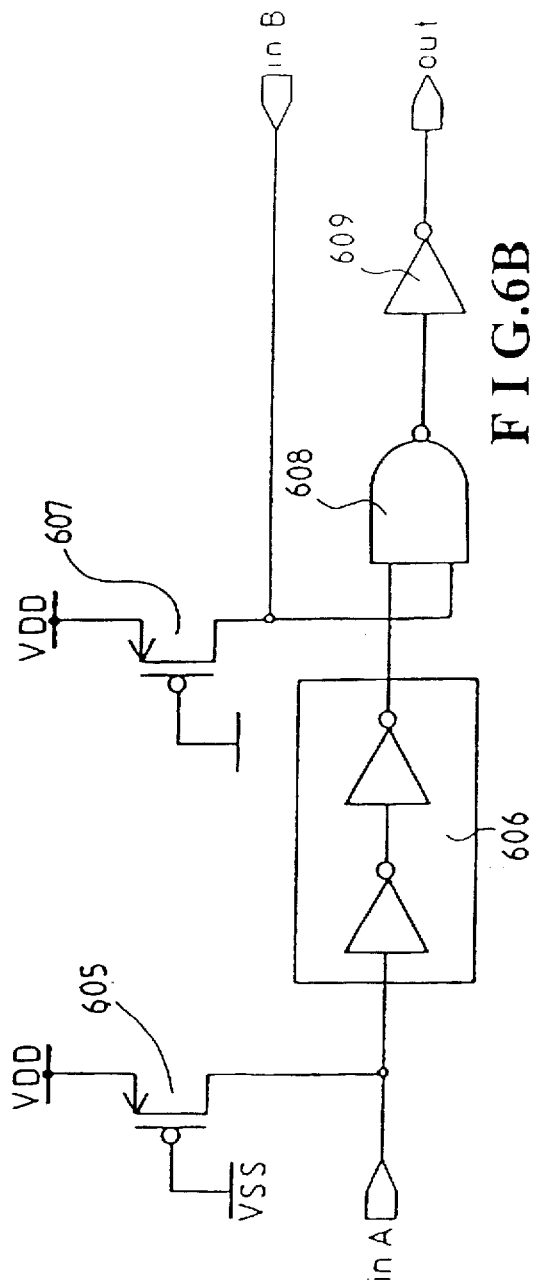

The receiver of the first embodiment of the SIOB as shown in FIG. 6B comprises a first pull high active resistor 605, a conventional input buffer RBUFF 606, a second pull high active resistor 607, a NAND gate 608 and a third inverter 609. There are two input signals 'inA' and 'inB' for receiving signals sent from a conventional input pad and a miniaturized input pad respectively. The only one output signal goes into the core logic inside the chip. No switching signal is necessary in the receiver because each input pad has a pull-high active resistor connected. The pull-high effect ensures that no interference exists between the two input signal paths at the NAND gate 608.

When the receiver is in operation, only one input pad can be bonded for interconnection. If the input pad for signal 'inA' is bonded while the other input pad is not connected, the input signal goes through the conventional input buffer 606, the NAND gate 608 and the third inverter 609 to the output node. The input signal 'inA' passes through the NAND gate 608 because the other input to the NAND gate 608 is pulled high. Similarly, when the input pad for signal 'inB' is bonded while the other input pad is not connected, the signal 'inB' can go directly to the output node through the NAND gate 608 and the inverter 609.

SECOND EMBODIMENT

Figure 7A:
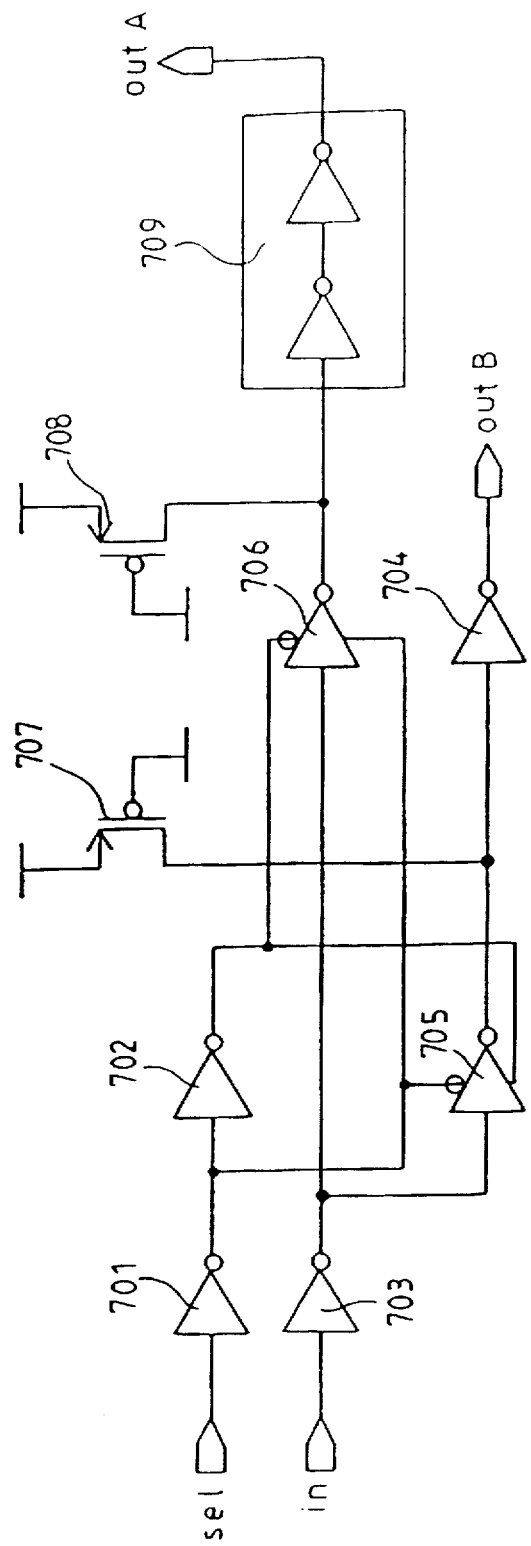
FIG. 7 shows the circuit structure for the transmitter and the receiver of the second embodiment of the switchable I/O buffer of the present invention in which two gated tri-state inverters are used for providing the path switching control.
Figure 7B:
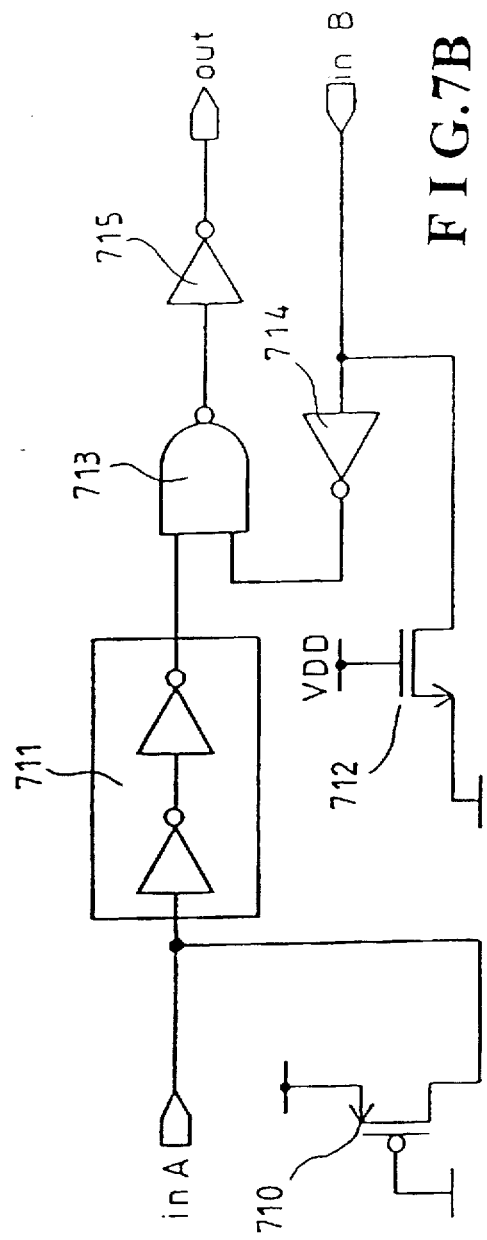

The second embodiment of the SIOB of the present invention is shown in FIG. 7. The transmitter of the second embodiment as shown in FIG. 7A comprises a first inverter 701, a second inverter 702, a third inverter 703, a fourth inverter 704, a first gated tri-state inverter 705, a second gated tri-state inverter 706, a first pull high active resistor 707, a second pull high active resistor 708 and a conventional output buffer TBUFF 709. Similar to the transmitter of the first embodiment, there are two input signals 'in' and 'sel', and two output signals 'outA' and 'outB'. The conventional output buffer path includes the third inverter 703, the second gated tri-state inverter 706 and the conventional output buffer 709. The miniaturized output buffer path of this invention includes the third inverter 703, the first gated tri-state inverter 705 and the fourth inverter 704.

When the signal 'sel' is pulled high by either a signal coming from an internal programmable storage cell or a hard-wired solder-ball input bump pad, the miniaturized output buffer path is selected because the first gated tri-state inverter 705 is active. On the contrary, the conventional output buffer path is selected because the second gated tri-state inverter 706 is active. Both of the two gated tri-state inverters are followed by pull-high active resistors. These active resistors remove the unknown states at the outputs of the gated tri-state inverters 705, 706 to avoid the possibility of consuming large power by both the fourth inverter 704 and TBUFF 709 when the tri-state inverters are in tri-state.

The receiver of the second embodiment of the SIOB is almost identical to that of the first embodiment except for an additional inverter. It comprises a third pull high active resistor 710, a conventional input buffer RBUFF 711, a first pull low active resistor 712, a NAND gate 713, a fifth inverter 714 and a sixth inverter 715. There are two input signals 'inA' and 'inB' for receiving signals sent from a conventional input pad and a miniaturized input pad respectively. The only one output signal goes into the core logic inside the chip. The addition of the fifth inverter 714 is necessary in that the corresponding miniaturized output buffer path of the transmitter has three inverters. The signals can therefore be kept in the same phase. The first pull-low active resistor 712 ensures that the output of the fifth inverter 714 is kept at high level when the input pad for 'inB' is not bonded.

THIRD EMBODIMENT

Figure 8A:
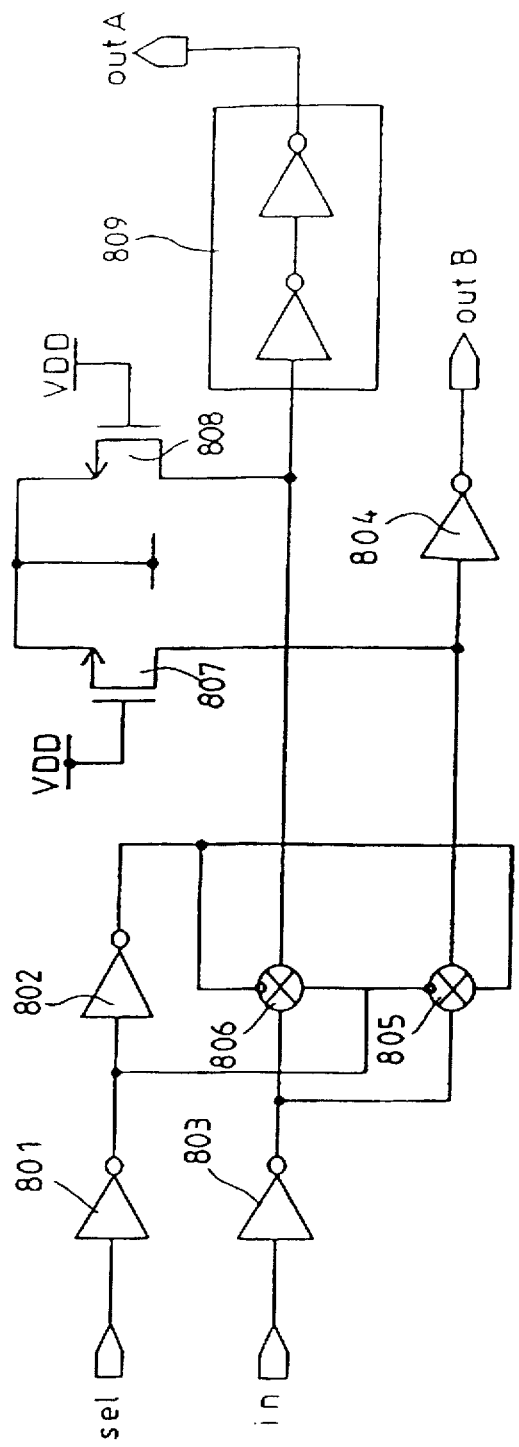
FIG. 8 shows the circuit structure for the transmitter and the receiver of the third embodiment of the switchable I/O buffer of the present invention in which two transmission gates are used for providing the path switching control.
Figure 8B:
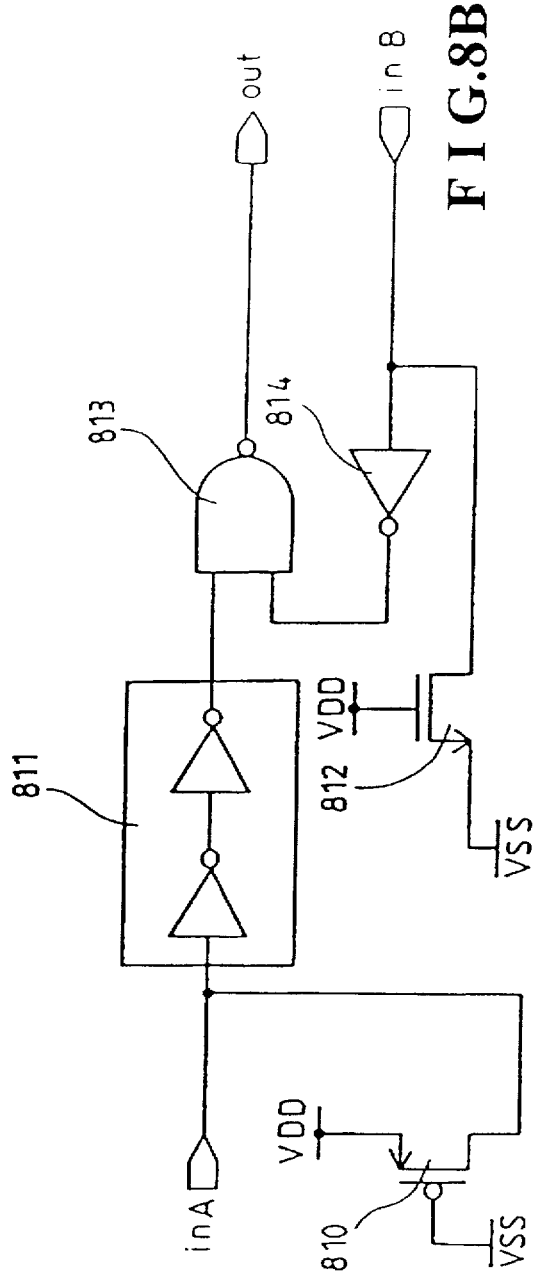

The third embodiment of the SIOB of the present invention is shown in FIG. 8. Instead of using gated tri-state inverters, the transmitter of the third embodiment as shown in FIG. 8A uses transmission gates. The transmitter comprises a first inverter 801, a second inverter 802, a third inverter 803, a fourth inverter 804, a first transmission gate 805, a second transmission gate 806, a first pull low active resistor 807, a second pull low active resistor 808 and a conventional output buffer TBUFF 809. The two transmission gates replace the two gated tri-state inverters of the second embodiment to serve as signal-gating devices. Two pull low active resistors rather than pull high active resistors are used in order to match the use of the transmission gates. Although the gated tri-state inverters of the second embodiment can provide extra signal enhancement and inversion, the transmission gates require a smaller area. Trade-off between the second and third embodiments can be made dependent on the requirement in the real application.

Similar to the transmitter of the second embodiment, there are two input signals 'in' and 'sel', and two output signals 'outA' and 'outB'. The conventional output buffer path includes the third inverter 803, the second transmission gate 806 and the conventional output buffer 809. The miniaturized output buffer path of this invention includes the third inverter 803, the first transmission gate 805 and the fourth inverter 804.

The receiver of the third embodiment of the SIOB is almost identical to that of the second embodiment except that one inverter is removed. It comprises a first pull high active resistor 810, a conventional input buffer RBUFF 811, a third pull low active resistor 812, a NAND gate 813 and a fifth inverter 814. The elimination of an inverter as compared to the receiver of the second embodiment results from the requirement in designing I/O buffers. In general the total number of inverters has to be identical in the receiver and the transmitter so that in-phase relationship can be maintained between the transmitted and received signals.

FOURTH EMBODIMENT

Figure 9A:
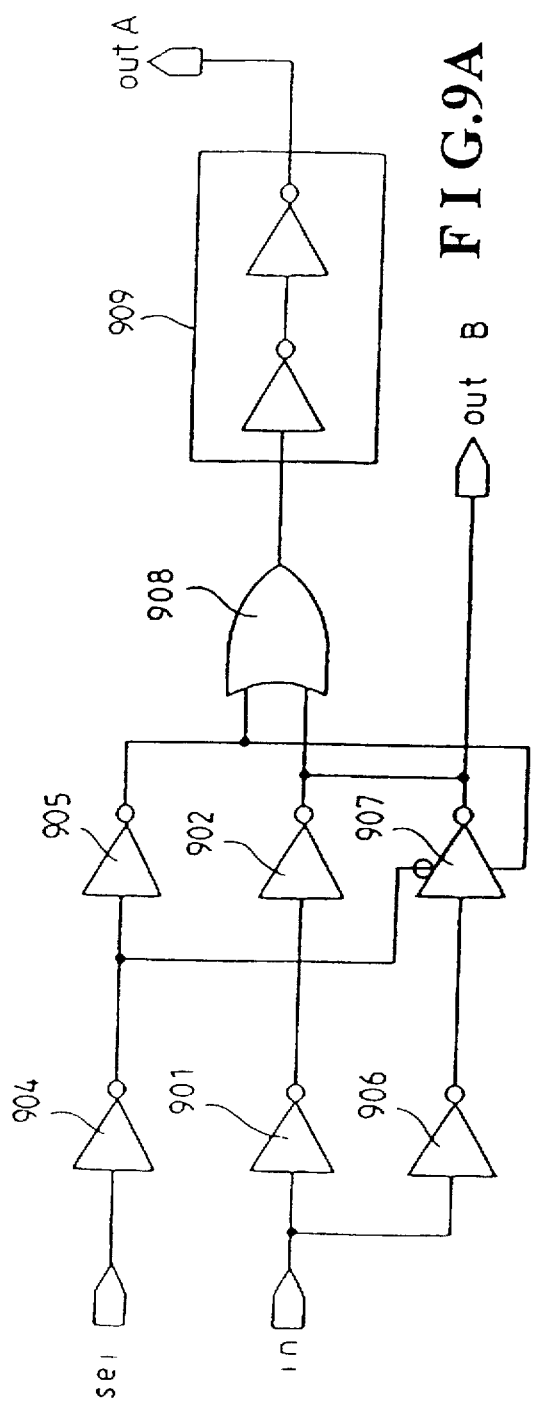
FIG. 9 shows the circuit structure for the transmitter and the receiver of the fourth embodiment of the switchable I/O buffer of the present invention in which an OR gate and a gated tri-state inverter are used for providing the path switching control.

FIG. 9 shows the fourth embodiment of the SIOB of this invention. The design of the transmitter in FIG. 9A is different from that of the second embodiment shown in FIG. 7 in that only one gated tri-state inverter is used. The transmitter comprises a first inverter 901, a second inverter 902, a fourth inverter 904, a fifth inverter 905, a sixth inverter 906, a gated tri-state inverter 907, an OR gate 908 and a conventional output buffer TBUFF 909. There are two input signals 'in' and 'sel', and two output signals 'outA' and 'outB'.

When the signal 'sel' is high, the miniaturized output buffer path is in use and the gated tri-state inverter is active (not in tri-state). The input signal 'in' passes through the sixth inverter 906 and the gated tri-state inverter 907 to the miniaturized output pad. At the same time, the signal 'in' also passes through the first and second inverters and reaches the same output pad. In an ideal case, the two signals should be in phase and enhance each other. In reality, there may exist some phase difference between them. It is important to keep the phase difference very small. If the signal 'sel' is low, the conventional output buffer path comprising the first inverter 901, the second inverter 902, the OR gate 908 and the conventional output buffer TBUFF 909 is in use.

Figure 9B:
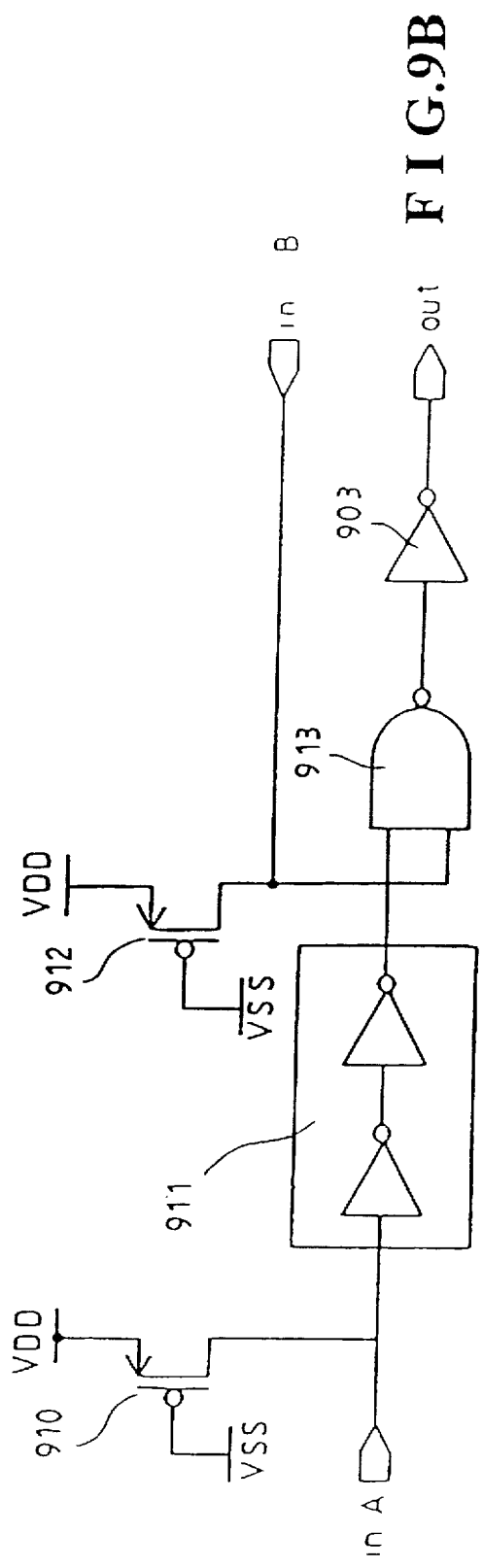

The receiver as shown in FIG. 9B of the fourth embodiment is exactly the same as that of the first embodiment as shown in FIG. 6B except for the component size. It comprises a first pull high active resistor 910, a conventional input buffer RBUFF 911, a second pull high active resistor 912, a NAND gate 913 and a third inverter 903. The operation of the receiver has been described earlier in the discussion of the first embodiment.

In using the SIOB, the choice between CIOB and MIOB paths should be made in both the transmitter and the receiver. The same type of transmitter and receiver must be used in pair. All four types of SIOB have been implemented and tested in a 0.9 um CMOS process. In general, the measured performance of SIOB can run above 250 MHz when the MIOB path is in use. When the CIOB path is chosen and a general type of CIOB is used as the TBUFF and RBUFF, only a 80 MHz operation speed can be measured for SIOB. The measured power consumption for each pair of SIOB, with MIOB in use, is about 25 mW at 250 MHz. The consumed power is in the same order as predicted by simulation. In addition, for the same order of consumed power, the CIOB path can only reach the operation speed of 80 MHz.

While the invention has been particularly shown and described with reference to these preferred embodiments, it will be understood by those skilled in the art that various changes in form and details may be made without departing from the spirit and scope of the invention. Although only the preferred embodiments of this invention were shown and described in the above description, it is requested that any modification or combination that comes within the spirit of this invention be protected.

What is claimed is:

1. A switchable input/output buffer structure for a multi-chip module comprising:

a transmitter having a pre-buffer including an output path switch for accepting a transmitter input signal and a path selection signal, a conventional output buffer and a miniaturized output buffer, said path selection signal controlling said output path switch for passing said transmitter input signal through said conventional output buffer to a conventional output pad of said transmitter if said conventional output pad is bonded for interconnection outside said multi-chip module, or passing said transmitter input signal through said miniaturized output buffer to a miniaturized output pad of said transmitter if said miniaturized output pad is bonded for chip-to-chip communication within said multi-chip module; and a receiver having an input path switch, a conventional input buffer and a miniaturized input buffer, said receiver accepting a miniaturized receiver input signal from a miniaturized input pad or a conventional receiver input signal from a conventional input pad for generating a receiver output signal, said input path switch passing said conventional receiver input signal through said conventional input buffer for outputting said receiver output signal if said conventional input pad is bonded for interconnection outside said multi-chip module, or passing said miniaturized receiver input signal through said miniaturized input buffer for outputting said receiver output signal if said miniaturized input pad is bonded for chip-to-chip communication within said multi-chip module.

2. The switchable input/output buffer structure for a multi-chip module according to claim 1, wherein said transmitter has a layout structure as shown in FIG. 4A comprising a layout area 401 for said pre-buffer including said output path switch, two layout areas 402 and 403 for said conventional output buffer, a layout area 404 for said miniaturized output buffer, a layout area 405 for said miniaturized output pad, and a layout area 406 for said conventional output pad; and said receiver has a layout structure as shown in FIG. 4B comprising two layout areas 407 and 408 for said conventional input buffer, a layout area 409 for said miniaturized input buffer, a layout area 410 for said conventional input pad, and a layout area 411 for said miniaturized input pad.

3. The switchable input/output buffer structure for a multi-chip module according to claim 1, wherein said transmitter has a layout structure as shown in FIG. 5A comprising a layout area 501 for said pre-buffer including said output path switch, two layout areas 502 and 503 for said conventional output buffer, a layout area 504 for said miniaturized output buffer, a layout area 505 for said miniaturized output pad, a layout area 506 for said conventional output pad, and a layout area 507 for an input pad providing a path switching signal from the substrate of said multi-chip module; and said receiver has a layout structure as shown in FIG. 5B comprising two layout areas 508 and 509 for said conventional input buffer, a layout area 510 for said miniaturized input buffer, a layout area 511 for said conventional input pad, and a layout area 512 for said miniaturized input pad.

4. The switchable input/output buffer structure for a multi-chip module according to claim 3, wherein said layout area 505 for said miniaturized output pad, said layout area 506 for said conventional output pad, and said layout area 507 for said input pad providing said path switching signal have an identical size.

5. A switchable input/output buffer for a multi-chip module comprising:

a transmitter including:
a first inverter having an input and an output, said first inverter input accepting a transmitter input signal;
an OR gate having a first input for receiving a path selection signal, a second input, and an output;
a conventional output buffer having an input connected to the output of said OR gate, and an output being connected to a first transmitter output;
and a second inverter having an input connected to the output of said first inverter, and an output connected to said second input of said OR gate, said second inverter output being connected to a second transmitter output;

and a receiver including:
a first receiver input being connected to a first pull high active resistor, said first receiver input accepting a first receiver input signal;
a second receiver input being connected to a second pull high active resistor, said second receiver input accepting a second receiver input signal;
a conventional input buffer having an input connected to said first receiver input, and an output;
a NAND gate having a first input connected to the output of said conventional input buffer, a second input connected to said second receiver input, and an output;
and a third inverter having an input connected to the output of said NAND gate and an output connected to a receiver output;

wherein said path selection signal is set to a low level to control said transmitter for passing said transmitter input signal to said first transmitter output if said first transmitter output is bonded for interconnection outside said multi-chip module or set to a high level to control said transmitter for passing said transmitter input signal to said second transmitter output if said second transmitter output is bonded for chip-to-chip communication within said multi-chip module, and said first receiver input signal is passed to said receiver output if said first receiver input is bonded for interconnection outside said multi-chip module or said second receiver input signal is passed to said receiver output if said second receiver input is bonded for chip-to-chip communication within said multi-chip module.

6. A switchable input/output buffer for a multi-chip module comprising:

a transmitter including:
   a first inverter having an input and an output, said first inverter input receiving a path selection signal; a second inverter having an input connected to the output of said first inverter, and an output;
   a third inverter having an input for accepting a transmitter input signal, and an output;
   a first gated tri-state inverter having an input connected to the output of said third inverter, an inverted gate control input connected to the output of said first inverter, a non-inverted gate control input connected to the output of said second inverter, and an output connected to a first pull high active resistor;
   a second gated tri-state inverter having an input connected to the output of said third inverter, an inverted gate control input connected to the output of said second inverter, a non-inverted gate control input connected to the output of said first inverter, and an output connected to a second pull high active resistor;
   a conventional output buffer having an input connected to the output of said second gated tri-state inverter and an output connected to a first transmitter output;
   and a fourth inverter having an input connected to the output of said first gated tri-state inverter and an output connected to a second transmitter output;

and a receiver including:
   a first receiver input being connected to a third pull high active resistor, said first receiver input accepting a first receiver input signal;
   a second receiver input being connected to a pull low active resistor, said second receiver input accepting a second receiver input signal;
   a conventional input buffer having an input connected to said first receiver input, and an output;
   a fifth inverter having an input connected to said second receiver input, and an output;
   a NAND gate having a first input connected to the output of said conventional input buffer, a second input connected to the output of said fifth inverter, and an output;
   and a sixth inverter having an input connected to the output of said NAND gate and an output connected to a receiver output;

wherein said path selection signal is set to a low level to control said transmitter for passing said transmitter input signal to said first transmitter output if said first transmitter output is bonded for interconnection outside said multi-chip module or set to a high level to control said transmitter for passing said transmitter input signal to said second transmitter output if said second transmitter output is bonded for chip-to-chip communication within said multi-chip module, and said first receiver input signal is passed to said receiver output if said first receiver input is bonded for interconnection outside said multi-chip module or said second receiver input signal is passed to said receiver output if said second receiver input is bonded for chip-to-chip communication within said multi-chip module.

* * * * *